(12) United States Patent
Ni et al.

(10) Patent No.: US 6,709,547 B1
(45) Date of Patent: Mar. 23, 2004

(54) MOVEABLE BARRIER FOR MULTIPLE ETCH PROCESSES

(75) Inventors: Tuqiang Ni, Fremont, CA (US); Kenji Takeshita, Fremont, CA (US); Brian K. McMillin, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/347,583

(22) Filed: Jun. 30, 1999

(51) Int. Cl.[7] .......................... C23F 1/00; H01L 21/306
(52) U.S. Cl. ................... 156/345.51; 156/915
(58) Field of Search ............................... 156/345

(56) References Cited

U.S. PATENT DOCUMENTS

| | | | |
|---|---|---|---|
| 5,213,658 A | * 5/1993 | Ishida | 156/643 |
| 5,498,313 A | 3/1996 | Bailey et al. | 156/643.1 |
| 5,552,124 A | * 9/1996 | Su et al. | 156/345 |
| 5,660,673 A | 8/1997 | Miyoshi | |
| 6,042,687 A | * 3/2000 | Singh et al. | 156/345 |
| 6,210,593 B1 | * 4/2001 | Ohkuni et al. | 216/59 |

FOREIGN PATENT DOCUMENTS

| | | | | |
|---|---|---|---|---|
| EP | 0676790 A1 | * 4/1995 | | H01J/37/32 |
| EP | 676 790 A1 | 10/1995 | | H01J/37/32 |
| EP | 10280173 | 10/1998 | | |

* cited by examiner

*Primary Examiner*—Nadine G. Norton
*Assistant Examiner*—DuyVu Deo
(74) *Attorney, Agent, or Firm*—Beyer Weaver & Thomas, LLP

(57) ABSTRACT

A process chamber for a plasma processing apparatus is provided in which etch uniformity is maintained in both chemically driven and ion driven processes. The process chamber utilizes a barrier whose position relative to a wafer may be changed. During chemically driven processes, the barrier may be established so as to substantially prevent the diffusion of neutral reactants from regions outside the perimeter of the wafer. During ion driven processes, the barrier may be moved (e.g., withdrawn) so as to not compromise the ion driven etch.

4 Claims, 5 Drawing Sheets

MOVEABLE BARRIER FOR MULTIPLE ETCH PROCESSES

FIELD OF THE INVENTION

The present invention relates to the fabrication of semiconductor-based devices. More particularly, the present invention relates to semiconductor manufacturing equipment that form semiconductor-based devices using etch processes.

BACKGROUND OF THE INVENTION

In the fabrication of semiconductor-based devices, e.g., integrated circuits or flat panel displays, layers of materials may alternately be deposited onto and etched from a substrate surface. As is well known in the art, the etching of the deposited layers may be accomplished by a variety of techniques, including plasma-enhanced etching. In plasma-enhanced etching, the actual etching typically takes place inside a plasma processing chamber. To form the desired pattern on the substrate surface, an appropriate mask (e.g., a photoresist mask) is typically provided. A plasma is then formed from a suitable etchant source gas, or mixture of gases, and used to etch areas that are unprotected by the mask, thereby leaving behind the desired pattern.

To facilitate discussion, FIG. 1A depicts a simplified semiconductor-based device processing apparatus 100 suitable for fabrication of semiconductor-based devices. The simplified semiconductor-based device processing apparatus 100 includes a wafer processing chamber 102 having an electrostatic chuck (ESC) 104. The ESC 104 acts as an electrode and supports a wafer 106 during fabrication. A focus ring 108 borders the edge of the ESC 104. In the case of etch processes, a number of parameters within the wafer processing chamber 102 are tightly controlled to maintain high tolerance etch results. Process parameters governing etch results may include gas composition, plasma excitation, plasma distribution over the wafer 106, etc. Since the etch tolerance (and resulting semiconductor-based device performance) is highly sensitive to such process parameters, accurate control thereof is required.

In a chemically driven plasma etch process, such as a metal etch, the local etch rate is dominated by the concentration of neutral reactants. Chemically driven etch processes include, for example, tungsten layer etching by fluorine, aluminum layer etching by chlorine and tungsten silicide etching by chlorine. In these chemically driven etch processes, there may be a depletion of available reactants in a middle portion 114 of the wafer 106 relative to the wafer perimeter 116. This differential availability of reactants is contributed to by diffusion of neutral reactants from neutral reactant rich regions 120 outside the wafer perimeter 116. The increased concentration of process gases near the wafer perimeter 116 increases the etch rate in the wafer perimeter 116, resulting undesirably in a non-uniform etch of the wafer 106. FIG. 1B illustrates a cross-section of the wafer following etch processes where the etched depth is greater at the wafer perimeter 116 than at the middle portion 114.

One known approach for improving etch rate uniformity in a chemically driven etch process is to install a diffusion barrier 118 around the wafer perimeter 116. The diffusion barrier 118 is effective in substantially impeding (i.e. restricting) the diffusion of neutral reactants from the neutral reactant rich regions 120 outside the wafer perimeter 116 into regions over the wafer 106. As a result, the use of the diffusion barrier 118 leads to improved etch uniformity in many chemically driven etch processes.

However, diffusion barriers, such as the diffusion barrier 118, are not used during ion-assisted (or ion-driven) etch processes (e.g. a plasma enhanced etch process). More specifically, the diffusion barrier 118 is believed to quench the plasma and thus disturb the ion density uniformity in the plasma In an ion-assisted etch process, the local etch rate is sensitive to ion concentration. An example of an ion-assisted process is chlorine etching of polysilicon layers. As a result, if the barrier 118 were to be used, the plasma density near the wafer perimeter 116 would be lowered and thus cause a non-uniform etching during an ion assisted/driven etch. Because the diffusion barriers compromise the quality of an ion-driven etch, separate plasma processing chambers are often used when both ion-assisted etching and chemically driven etching is to be performed.

Undesirably, as a result of this processing conflict, a facility may need to purchase, run and maintain two separate and costly machines to perform chemically driven and ion driven etch processes. Additionally, to perform a chemically driven etch process and an ion driven etch process on the same wafer, the wafer must be exchanged between two separate machines. This considerably slows processing time as the wafer must be transferred and each apparatus must separately establish its highly controlled processing conditions. Further, the increase in processing time decreases throughput and increases wafer processing costs.

In view of the foregoing, there is a need for improved approaches to performing etch processes in semiconductor manufacturing equipment.

SUMMARY OF THE INVENTION

Broadly speaking, the invention relates to a semiconductor manufacturing apparatus having a diffusion barrier that can be positioned in multiple positions relative to the wafer. In one position, the diffusion barrier acts to inhibit diffusion of neutral species which may compromise etch uniformity or quality of chemically driven etch processes. In another position, the barrier is recessed so as to not disturb an ion-assisted etch process. Advantageously, these two types of etch processes may be performed, either for the same wafer or alternate wafers, within the same chamber. For multiple etch processes of different types occurring on a single wafer, the invention can yield a substantial decrease in production time and cost.

The invention relates in one embodiment of the present invention to a semiconductor-based device processing apparatus. The apparatus includes a chuck for supporting a wafer. The apparatus also includes a barrier having a first position relative to the wafer wherein the first position relative to the wafer substantially facilitates etch uniformity for a chemically driven etch process, and having a second position relative to the wafer wherein the second position relative to the wafer does not interfere with the etch uniformity of an ion driven etch process.

In another embodiment, the invention relates to a semiconductor-based device processing apparatus. The apparatus includes a chuck for supporting a wafer. The apparatus also includes a moveable barrier having a first position and a second position, wherein the first position is capable of restricting diffusion of gases within the plasma processing apparatus to the wafer.

In yet another embodiment, a method for performing a multi-step etch within a semiconductor-based device processing apparatus is provided. The semiconductor-based device processing apparatus includes a barrier having a first position relative to the wafer facilitative of a first etch process and a second position relative to the wafer for facilitating a second etch process. The method includes performing the first etch process with the barrier in the first position relative to the wafer. The method also includes changing the position of the barrier relative to the wafer from the first position relative to the wafer to the second position relative to the wafer and then includes performing the second etch process with the barrier in the second position relative to the wafer.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings in which like reference numerals refer to similar elements, and in which.

DETAILED DESCRIPTION OF THE INVENTION

In the following detailed description of the present invention, numerous specific embodiments are set forth in order to provide a thorough understanding of the invention However, as will be apparent to those skilled in the art, the present invention may be practiced without these specific details or by using alternate elements or processes. In other instances well known processes, procedures, components, and circuits have not been described in detail so as not to unnecessarily obscure aspects of the present invention.

Figure 1A:
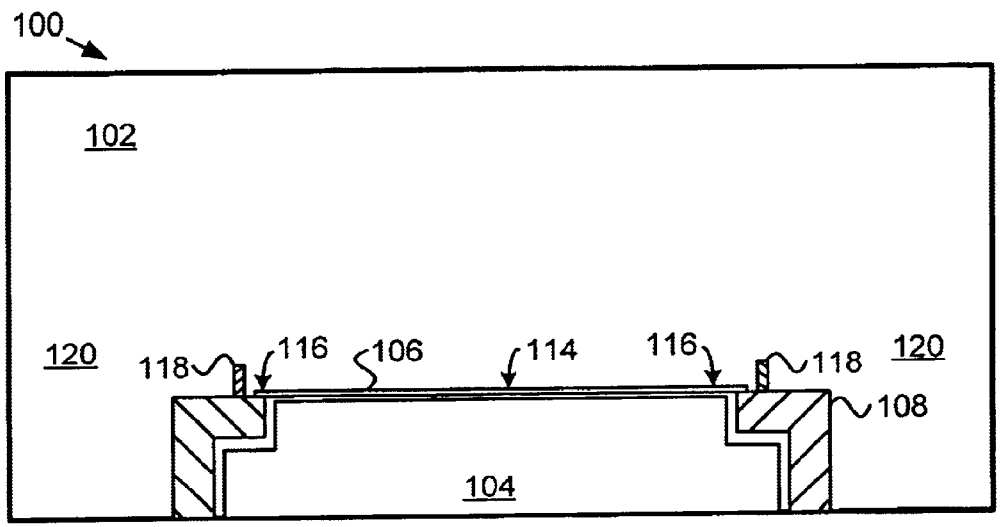
FIG. 1A depicts a simplified semiconductor-based device processing apparatus suitable for fabrication of semiconductor-based devices.
Figure 1B:
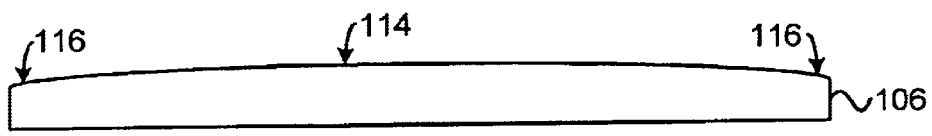
FIG. 1B illustrates a non-uniform etch of a wafer as a result of increased concentration of process gases near the wafer perimeter.
Figure 2A:
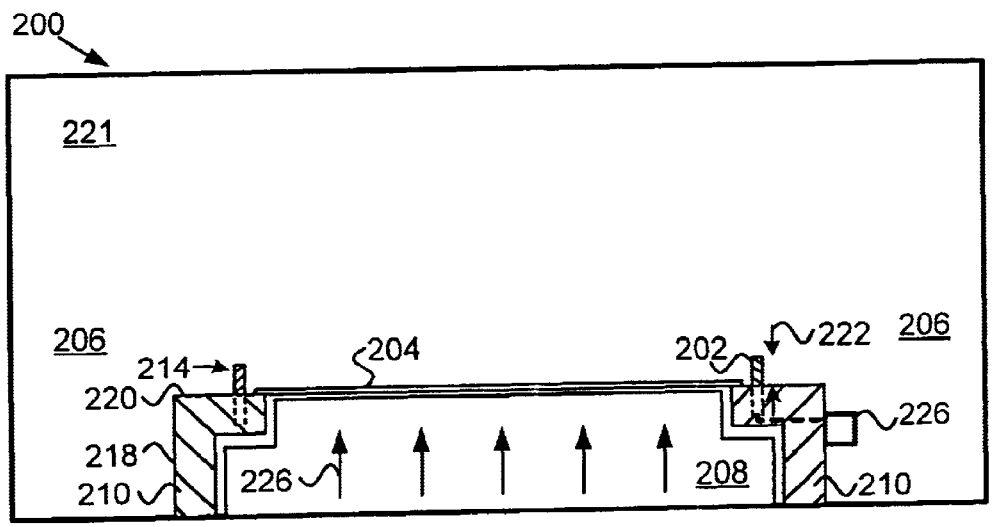
FIGS. 2A and 2B illustrates a semiconductor-based device processing apparatus including a barrier whose position relative to the wafer can change in accordance with one embodiment of the present invention.
Figure 2B:
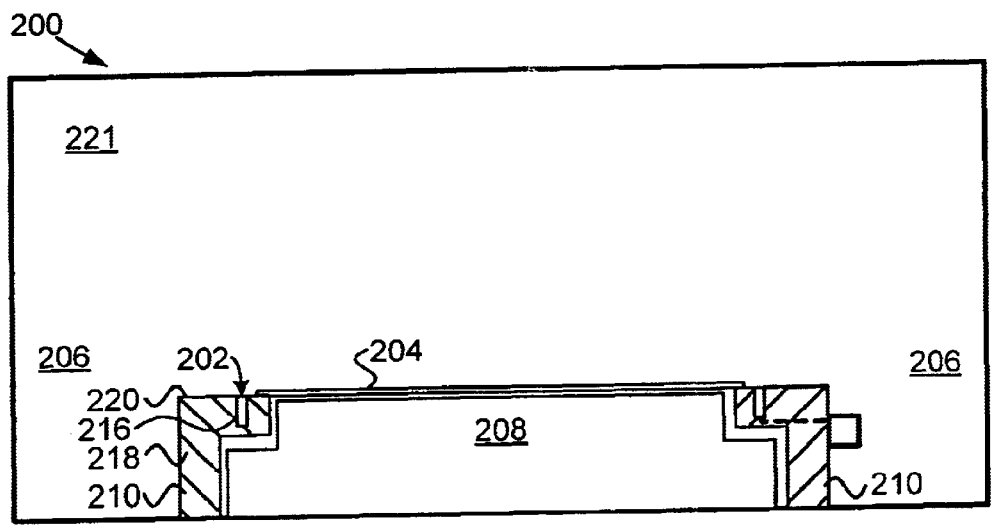

In accordance with one aspect of the present invention, there is provided a semiconductor-based device processing apparatus in which etch uniformity is managed in both chemically driven and ion driven/assisted processes. FIGS. 2A and 2B illustrate a semiconductor-based device processing apparatus 200 including a barrier 202 whose position relative to a wafer 204 is not fixed. Correspondingly, during chemically driven processes, the position of the barrier 202 relative to the wafer 204 may be established so as to substantially reduce the diffusion of neutral reactants from regions 206 outside the perimeter of the wafer 204 towards portions within the perimeter of the wafer 204. However, during ion driven/assisted processes, the barrier 202 may be moved to a position so as to not compromise the ion driven/assisted processes. As an example, one chemically driven process is a chemically driven etch, and one ion driven/assisted process is an ion driven etch.

The semiconductor-based device processing apparatus 200 also includes a wafer support such as an electrostatic chuck (ESC) 208. The ESC 208 may act as an electrode and is responsible for supporting or fixturing the wafer 204 during fabrication. A focus ring 210 borders the edge of an electrode 212. The focus ring 210 acts as an insulator and is typically made of dielectric material or a highly resistive conductor. One function of the focus ring 210 is to protect the edges of the electrode 212 from sputtering due to impinging ions which can degrade the electrode 212 and/or contaminate the plasma. A second function of the focus ring 210 is to help maintain uniform ion bombardment 226 in the normal direction to the surface of the wafer 204. This uniform bombardment is important during ion driven processes, where edge effects in the electric field may compromise the ion directionality and thereby compromise pattern transfer fidelity during the etch.

The barrier 202 is able to move relative to the wafer 204. In this case, the barrier 202 is moved such that it has multiple positions within the semiconductor-based device processing apparatus 200. As illustrated in FIG. 2A, the barrier 202 has an elevated position 214 where it functions as a barrier during a chemically driven process, namely a chemically driven etch process. More specifically, the barrier 202 acts to substantially reduce the diffusion of neutral reactants from the regions 206 outside the perimeter of the wafer 204 towards portions within the perimeter of the wafer 204. As a result, a more substantially uniform collection of neutral reactants is provided across the wafer 204 during the chemically driven etch process.

Additionally, as illustrated in FIG. 2B, the barrier 202 also has a recessed position 216 where it does not act as a barrier and thus does not compromise an ion driven process. More specifically, when the barrier is in the recessed position 216, plasma uniformity and ion directionality are provided across the entire wafer 204 without disruption due to the barrier 202. For the semiconductor-based device processing apparatus 200 shown in FIG. 2B, the recessed position 216 is within a portion 218 of the focus ring 210. In this embodiment, the barrier 202 is situated below the wafer 204 and within the focus ring 210 such that it is either flush with or below an upper surface 220 of the focus ring 210. An actuator 226 can operate to move the barrier 202 between the recessed position 216 and the elevated position 214, or various levels between these positions.

Alternately, the recessed position 216 for the barrier 202 can be any position within the plasma processing apparatus 200 such that it does not interfere with or substantially compromise an ion-driven etch process. By way of example, the barrier 202 may be raised or shifted within a processing chamber 221 of the semiconductor-based device processing apparatus 200 to any non-intrusive position above the ESC 208.

As an another alternative, as opposed to moving the barrier 202, the ESC 208, or any part thereof, can be moved to permit relative motion between the barrier 202 and the wafer 204. By way of example, the ESC 208 may be manipulated vertically while the barrier 202 remains stationary. In yet another embodiment, the barrier 202 may rest upon a series of pins elevated above the focus ring 210 such that ion etch uniformity is not compromised.

Correspondingly, loading of the wafer 204 may be performed between the pins. The pins then may lower into the focus ring 210 to set the barrier 202 into the barrier position 214 for a chemically driven etch. It should also be understood that the barrier 202 need not be a single piece and may be constructed of multiple pieces which separate when not in the barrier position 214. More specifically, the barrier 202 may be constructed of two pieces, each of which can move horizontally towards the walls of the chamber 221 during non-chemically driven processes.

Preferably, the barrier 202 surrounds the periphery of the wafer 204 and has a shape that is coincident with that of the wafer 204. Typically, the shape of the barrier 202 is circular or rectangular for wafers and flat panel displays, respectively. Numerous alterations of the barrier 202 are possible to accommodate a wide variety of design implementations. By way of example, the barrier 202 may have a hole to permit a wafer transfer blade or wafer to pass through the barrier 202 to facilitate loading and unloading.

Figure 2C:
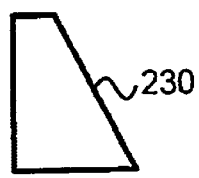
FIG. 2C illustrates a barrier suitable for use in the present invention in which at least a portion of the barrier is tapered.

Alternatively, the barrier 202 may be shaped such that it facilitates an etch process. The size and profile of the barrier 202 may vary based upon numerous factors. For example, the size and profile of the barrier 202 may vary based on the wafer 204 size, wafer 204 properties, etch chemistry, etc. In one embodiment, the height 222 of the barrier may range from ½ inches to 4 inches. For an aluminum etch, the barrier is preferably within ½ inches to 2 inches. The size and profile of the barrier 202 may also be dependent upon proximity to the wafer 206. By way of example, the proximity may range from ⅛ inches to 2 inches. In a specific embodiment, the proximity is preferably in the range of ¼ inches to ¾ inches for a 200 mm wafer. Of course, the height 222 or size of the barrier 202 may be adapted with increasing proximity. Further, the barrier 204 is not limited to any particular profile. By way of example, the barrier 230 may have a rectangular profile or may be tapered as illustrated in FIG. 2C. The barrier 230, or a portion thereof, is tapered to alter sensitivity to ion uniformity across the wafer 204 during a chemically driven etch process.

Figure 3A:
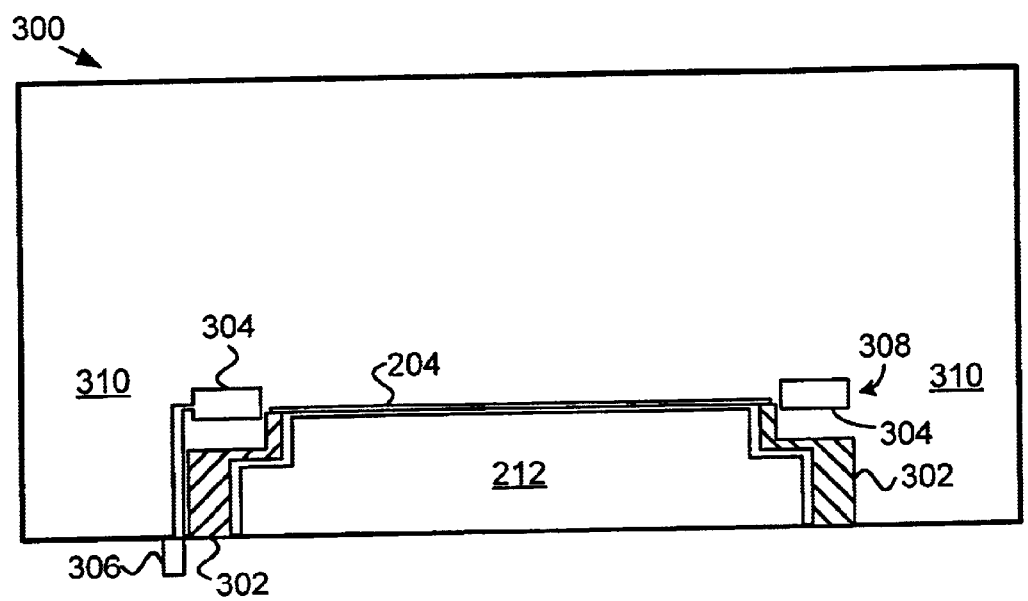
FIGS. 3A and 3B illustrate a semiconductor-based device processing apparatus in which the focus ring is fabricated in two pieces and one piece acts as a barrier.
Figure 3B:
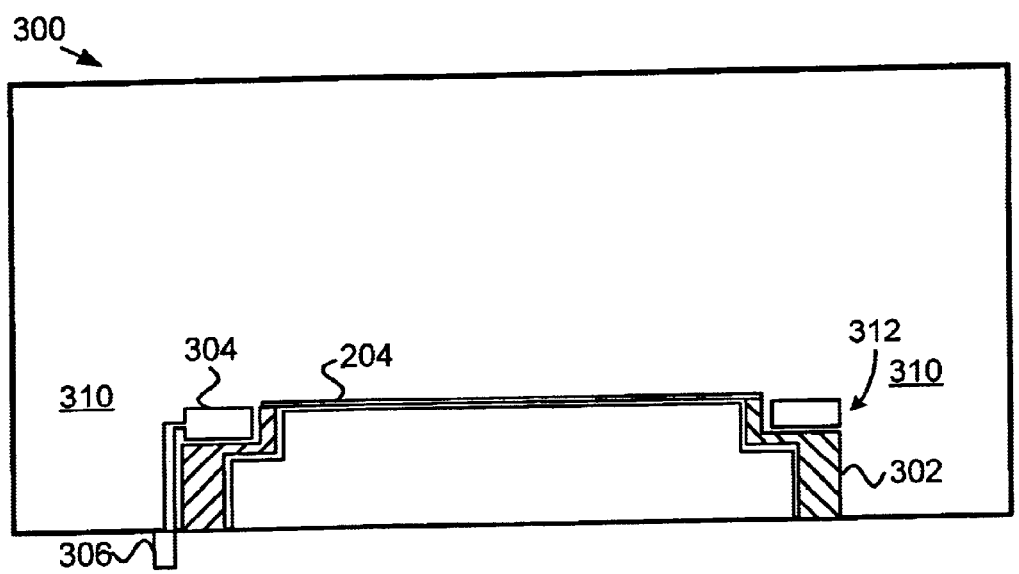

FIGS. 3A and 3B illustrate a semiconductor-based device processing apparatus 300 in which a focus ring is fabricated in two pieces. In this embodiment, a lower portion 302 of the focus ring provides coverage for the electrode 212. An upper portion 304 of the focus ring can be translated up or recessed down by attaching the upper portion 304 to an actuator 306. The upper portion 304, when in an raised position 308, functions to substantially inhibit (i.e., restrict) the diffusion of neutral reactants from neutral reactant rich regions 310 outside the wafer 204 to regions over the wafer 204. In addition, the upper portion 304 has a recessed position 312 (FIG. 3B) in which it may function as an additional part of the focus ring.

The semiconductor-based device processing apparatus 200 may be implemented with new or existing plasma processing equipment. In a preferred embodiment, the semiconductor-based device processing apparatus 200 is applied using a 300 mm or 200 mm wafer fabrication device, such as a TCP9400 as manufactured by Lam Research Corp. of Fremont, Calif.

Figure 4:
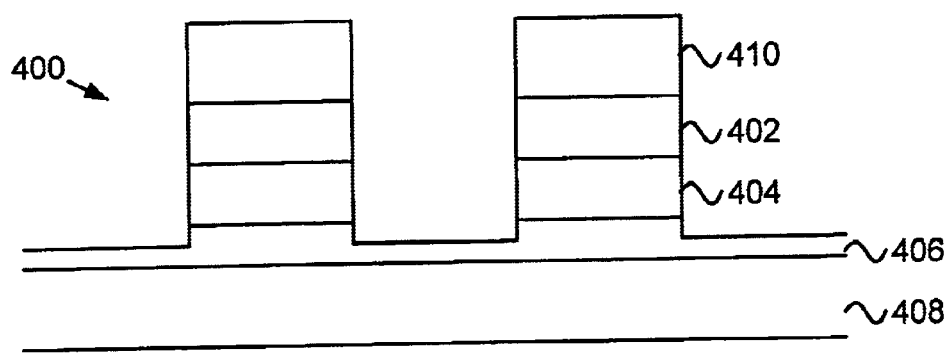
FIG. 4 illustrates a metal gate device to be etched by the semiconductor-based device processing apparatus.

The present invention is suitable for application to a wafer with a stack of films to be etched together but having different etch characteristics. By way of example, FIG. 4 illustrates a metal gate device 400 etched by the semiconductor-based device processing apparatus 200 according to one embodiment of the present invention. The metal gate device 400 includes a metal layer 402 (e.g., tungsten) deposited above a polysilicon layer 404, which is further deposited above a dielectric layer 406, which in turn is deposited above a substrate 408. A photoresist layer 410, or other suitable hard mask, may also be included above the metal layer 402 to facilitate patterning the etch.

In this application, the metal layer 402 and the polysilicon layer 404 must be etched through while stopping at the dielectric layer 406. Typically, etching the metal layer 402 requires a chemically driven etch process while etching the polysilicon layer 404 requires an ion driven etch process. If a hard mask is used for the photoresist layer 410, an additional ion driven etch would be required. Advantageously, the semiconductor-based device processing apparatus 200 is capable of etching the metal gate device 400 through the use of a single processing apparatus. Advantageously, the invention also avoids breaking the vacuum and re-seasoning the process conditions within the chamber 221 in order to switch between different types of etch processes. As a result, manufacturing time is reduced for a single wafer.

Advantageously, the semiconductor-based device processing apparatus 200 permits multiple types of etches to be performed in the same chamber without compromising the quality of any etch. Thus, the requirement for two separate processing chambers within a facility, one for ion driven processes and a second for chemically driven processes, may be eliminated. This desirably reduces the need for purchasing, running and maintaining two conventionally separate machines. In addition, the semiconductor-based device processing apparatus 200 may also implement other plasma processing chamber processes. By way of example, another etch process may be performed on the wafer 204 after an ion etch and before the barrier 202 is moved to facilitate a chemical etch.

The present invention is particularly suited to any combination of a chemically driven etch and an ion driven/assisted etch, the order of which may vary. It should be noted that an application may contain multiple forms of either etch process. By way of example, a wafer may include an ion assisted etch followed by a chemically assisted etch further followed by a second ion assisted etch. Although the metal layers have been described with reference to tungsten and aluminum, the present invention applies to any metal etch or chemically driven process. Similarly, although the present invention has been described with respect to polysilicon, any material or process sensitive to an ion concentration and distribution is applicable to the present invention.

The position of the barrier relative to the wafer may be manipulated during etch process. More specifically, the position of the barrier relative to the wafer may be altered process step by process step for the wafer. Similar to other process conditions, the position control may be implemented by a computer responsible for controlling numerous process parameters.

Figure 5:
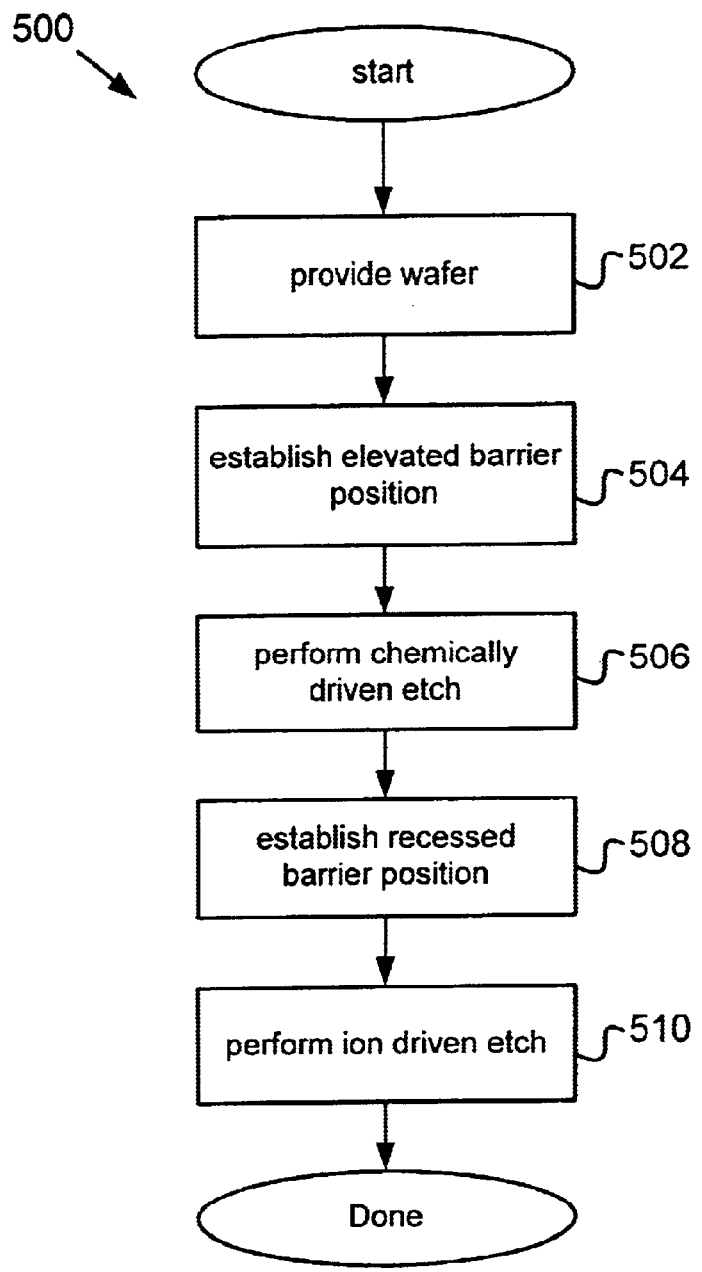
FIG. 5 illustrates a process of processing the metal gate device within the semiconductor-based device processing chamber in accordance with another embodiment of the present invention.

FIG. 5 illustrates a process 500 of processing the metal gate device 400 within the semiconductor-based device processing apparatus 200 in accordance with one embodiment of the present invention. The process 500 involves a multi-step etch which uses two different types of etching in a single semiconductor-based device processing apparatus without requiring any re-configuration of the apparatus for the different types of etch processes.

The process 500 begins with the barrier 202 in the recessed position 216 while the metal gate device 400 (e.g., wafer with film layers deposited thereon) is provided (502). The barrier 202 is then moved relative to the metal gate device 400 until the elevated position 214 is established (504). At this point, etching of the metal layer 402 may proceed (506). After the metal layer 402 is etched, a signal may be sent to the actuator 226 to move the barrier 202 to the recessed position 216. The barrier 202 is then moved relative to the metal gate device 400 to the recessed position 216 (508). Thereafter, the ion driven etch of the polysilicon layer 404 proceeds (510).

The position of the barrier 202 relative to the wafer 204 may be manipulated in a number of ways. By way of example, the actuator 226 may include pneumatic power. Alternatively, a stepper motor linked to a computer may be used to incrementally control the position of the barrier 202. Thus, the height of the barrier 202 may be varied for different processes. More specifically, the height 222 of the barrier 202 may be varied between or during processes, e.g., for different metals. Further, a flexible bellows may be actuated to move the ESC 208 relative to the barrier 202. Of course, any suitable form of actuation may be used to manipulate the position of either the barrier 202 and any portion of the ESC 208 to provide the relative movement.

The barrier 202 is preferably made of a material which is not reactive with the plasma in the plasma processing chamber or with the etchant gases. Additionally, the barrier 202 preferably does not have any contaminating effects with the processes. For example, a dielectric material comprising ceramic or quartz may be a suitable material for the barrier 202.

Although only a few embodiments of the present invention have been described in detail, it should be understood that the present invention may be embodied in many other specific forms without departing from the spirit or scope of the invention. Particularly, silicon, or any other material may be etched in the simplified plasma processing chamber 200. Alternately, although the invention has been described with resect to chemically driven and ion driven etches, other plasma processing chamber operations may be performed in the present invention with the barrier 202 in any position relative to the wafer 204. Therefore, the present examples are to be considered as illustrative and not restrictive, and the invention is not to be limited to the details given herein, but may be modified within the scope of the appended claims.

What is claimed is:

1. A semiconductor-based device processing apparatus comprising:

a chuck for supporting a wafer; and a barrier having a first position relative to the wafer wherein the first position relative to the wafer substantially facilities etch uniformity for a chemically driven etch process, and having a second position relative to the wafer wherein the second position relative to the wafer does not interfere with the etch uniformity of an ion driven etch process, wherein the chuck is moved to establish the first and the second position of the barrier relative to the wafer.

2. The apparatus as recited in claim 1 wherein the barrier has a top surface and the wafer has a top surface wherein in the second position the top surface of the barrier is not above the top surface of the wafer.

3. The apparatus as recited in claim 2 wherein the first position is substantially above the wafer and the second position is substantially below the wafer.

4. The apparatus as recited in claim 1 wherein the barrier surrounds the periphery of the wafer.

* * * * *